(12) United States Patent
Kikutani

(10) Patent No.: US 7,923,375 B2
(45) Date of Patent: Apr. 12, 2011

(54) METHOD FOR MANUFACTURING SEMICONDUCTOR DEVICE

(75) Inventor: Keisuke Kikutani, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 853 days.

(21) Appl. No.: 11/892,131

(22) Filed: Aug. 20, 2007

(65) Prior Publication Data

US 2008/0045026 A1 Feb. 21, 2008

(30) Foreign Application Priority Data

Aug. 21, 2006 (JP) ................................. 2006-224319

(51) Int. Cl.
*H01L 21/302* (2006.01)
(52) U.S. Cl. ......... 438/745; 438/514; 438/717; 438/755
(58) Field of Classification Search .................. 438/276, 438/298, 700, 705, 710, 480, 514, 706, 717, 438/745, 755
See application file for complete search history.

(56) References Cited

U.S. PATENT DOCUMENTS

| 5,266,157 A | | 11/1993 | Kadomura | |
|---|---|---|---|---|
| 5,607,868 A | * | 3/1997 | Chida et al. | 438/258 |
| 6,140,168 A | * | 10/2000 | Tan et al. | 438/197 |
| 6,774,043 B2 | | 8/2004 | Yamaguchi et al. | |
| 2006/0051965 A1 | * | 3/2006 | Edelberg et al. | 438/706 |
| 2006/0115990 A1 | | 6/2006 | Seino et al. | |

FOREIGN PATENT DOCUMENTS

JP 2006-140222 A 6/2006

* cited by examiner

*Primary Examiner* — Lan Vinh
(74) *Attorney, Agent, or Firm* — Finnegan, Henderson, Farabow, Garrett & Dunner, L.L.P.

(57) ABSTRACT

A method for manufacturing a semiconductor device includes forming a photo-resist pattern above a first film, implanting a predetermined dopant that increases an etching rate of the first film into the first film using the photo-resist pattern as a mask, thereby forming an implantation layer in the first film, and etching a first portion of the first film, which is at least a part of the implantation layer, using the photo-resist pattern as a mask.

18 Claims, 3 Drawing Sheets

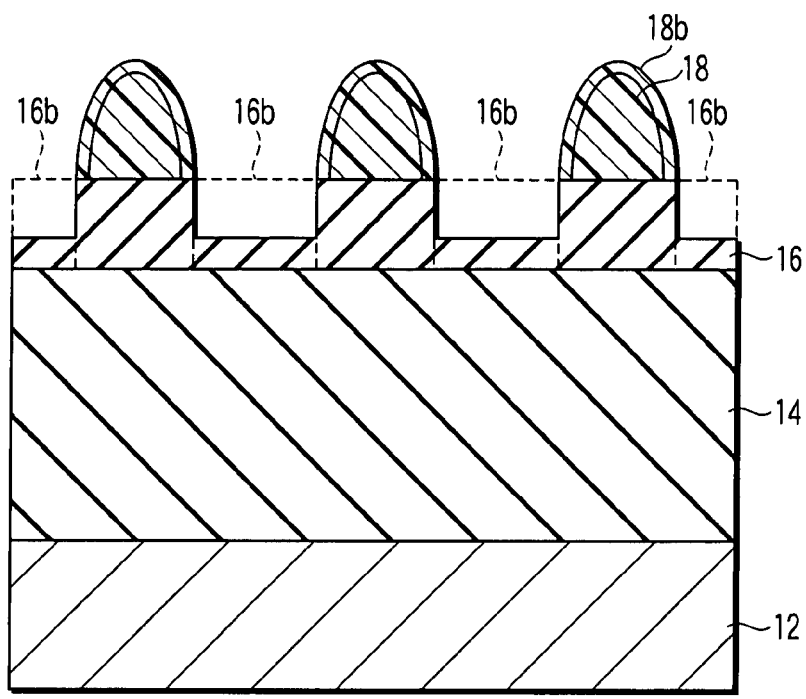
F I G. 3
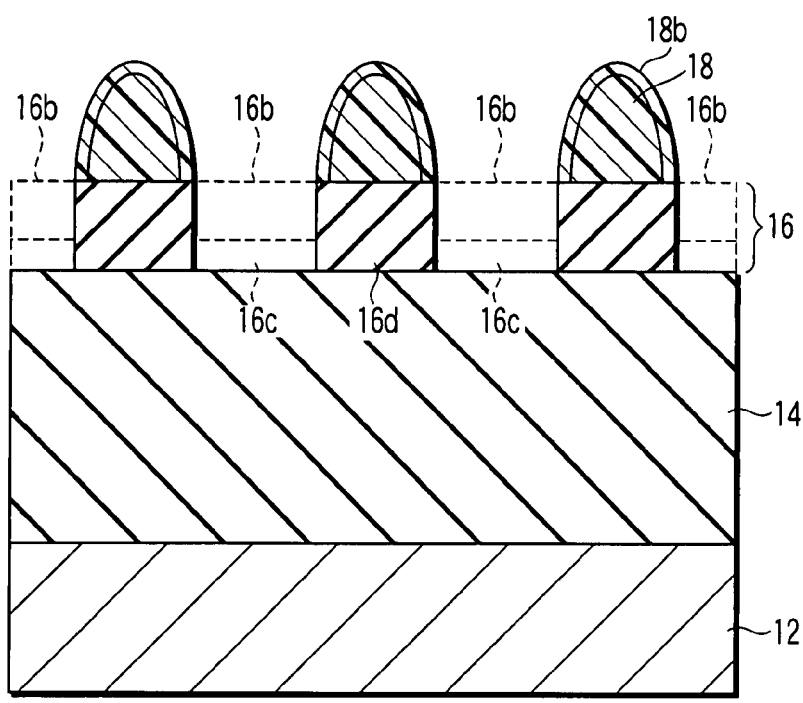
F I G. 4

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2006-224319, filed Aug. 21, 2006, the entire contents of which are incorporated herein by reference.

BACKGROUND OF THE INVENTION

1. Field of the Invention

The present invention relates to a method for manufacturing a semiconductor device.

2. Description of the Related Art

Owing to the demands of miniaturization of semiconductor devices, the thickness of photo-resist films is becoming increasingly smaller. Accordingly, it has become difficult to ensure a sufficient etching resistance only by a photo-resist film. In light of this problem, there has been proposed a pattern transferring technique utilizing a multilayer resist (for example, see Jpn. Pat. Appln. KOKAI Publication No. 2006-140222). In general, a multilayer resist is formed of a lower film, an intermediate film, and an upper film (photo-resist film).

However, along with a further decrease in the thickness of photo-resist films, a problem arises in that a photo-resist pattern disappears when the photo-resist pattern is used as a mask in dry etching of the intermediate film. In this case, since that portion of the intermediate film which serves as a mask is etched, it is difficult to form an adequate pattern at the intermediate film. If wet etching is used for the same purpose, the photo-resist pattern may be prevented from disappearing. However, since wet etching is isotropic etching, in which the etching proceeds in a lateral direction as well, the photo-resist pattern cannot be faithfully transferred to the intermediate film. Conventionally, because of such a reason, it is difficult to form an adequate pattern at the intermediate film, and thus is also difficult to reliably form a device pattern, such as an interconnection pattern, with high accuracy.

The problem described above is caused not only in a case where a multilayer resist is used for patterning an etching target film, but also in a case where a photo-resist pattern formed directly on an etching target film is used as a mask for etching the etching target film.

As described above, conventionally, there is a problem in that, when a photo-resist pattern is used as a mask for etching an underlying film, it is difficult to form an adequate pattern.

BRIEF SUMMARY OF THE INVENTION

According to an aspect of the present invention, there is provided a method for manufacturing a semiconductor device, the method comprising: forming a photo-resist pattern above a first film; implanting a predetermined dopant that increases an etching rate of the first film into the first film using the photo-resist pattern as a mask, thereby forming an implantation layer in the first film; and etching a first portion of the first film, which is at least a part of the implantation layer, using the photo-resist pattern as a mask.

BRIEF DESCRIPTION OF THE SEVERAL VIEWS OF THE DRAWING

FIGS. 1 to 6 are sectional views showing a method for manufacturing a semiconductor device according to an embodiment of the present invention.

DETAILED DESCRIPTION OF THE INVENTION

An embodiment of the present invention will now be described with reference to the accompanying drawings.

FIGS. 1 to 6 are sectional views showing a method for manufacturing a semiconductor device according to an embodiment of the present invention.

Figure 1:
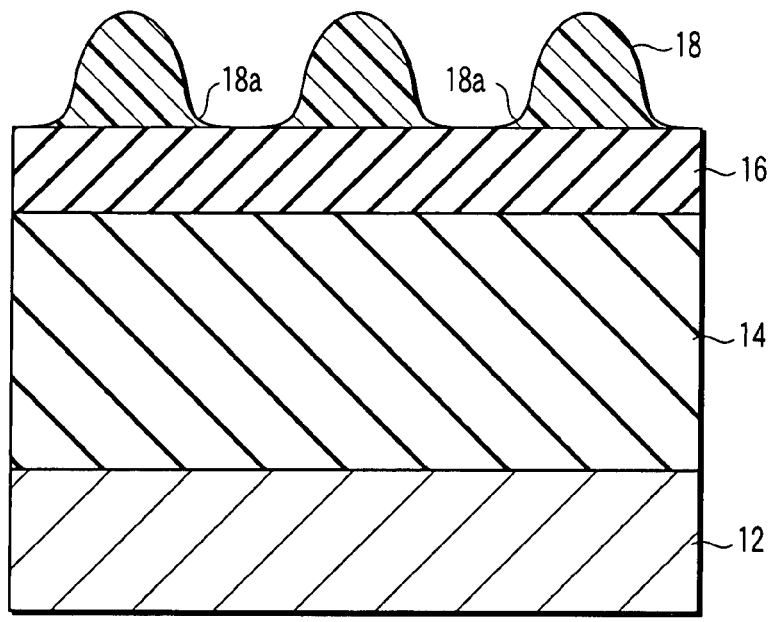

At first, as shown in FIG. 1, an etching target film (third film) 12 is formed on an area (not shown) including a transistor, an inter-level insulating film, and so forth. The etching target film 12 is formed of a metal film for forming an interconnection pattern, but it may be formed of another film, such as an oxide film or nitride film.

Then, a carbon film is formed as the lower film (second film) 14 of a multilayer resist on the etching target film 12 by a CVD method or coating method. The carbon film contains carbon as the main component and further contains oxygen and hydrogen. The thickness of the lower film 14 is determined in accordance with the etching selectivity ratio between the etching target film 12 and lower film 14.

Then, a silicon oxide family film, such as a BSG film or TEOS film, is formed as the intermediate film (first film) 16 of the multilayer resist on the lower film 14 by an LPCVD method. The thickness of the intermediate film 16 is set to be about 30 nm to 45 nm.

Then, a photo-resist film is formed as the upper film of the multilayer resist on the intermediate film 16 by a coating method. Thereafter, patterning is performed on the photo-resist film by photolithography to form a photo-resist pattern 18. After the photolithography, the thickness of the photo-resist film is about 40 nm to 65 nm. The photo-resist pattern 18 is arranged to form an interconnection pattern, and has a line width (interconnection line width) and a space width, each of which is set to be about 45 nm or less. Since the width of the photo-resist pattern 18 is narrow, the photo-resist pattern 18 can easily fall if the sidewalls of the photo-resist pattern 18 are vertical. Accordingly, the photo-resist pattern 18 is formed such that the sidewalls are inclined. Consequently, the photo-resist pattern 18 has skirt portions 18a formed along the surface of the intermediate film 16. Under ordinary circumstances, the skirt portions 18a are preferably not formed, but the inclined sidewalls of the photo-resist pattern 18 bring about the skirt portions 18a.

After the step shown in FIG. 1, if dry etching using, e.g., $CF_4$ family gas is performed to etch the intermediate film 16, a problem arises in that the photo-resist pattern 18 disappears during the dry etching. In this case, since that portion of the intermediate film 16 which serves as a mask is etched, it is difficult to form an adequate pattern at the intermediate film 16. As a result, it is difficult to reliably form a device pattern, such as an interconnection pattern. Further, the skirt portions 18a of the photo-resist pattern 18 serve as an etching mask at least in the early stage of the dry etching and hinder the etching of the intermediate film 16. Consequently, bridging portions or the like are formed between patterns, and make it difficult to reliably form a device pattern, such as an interconnection pattern.

Figure 2:
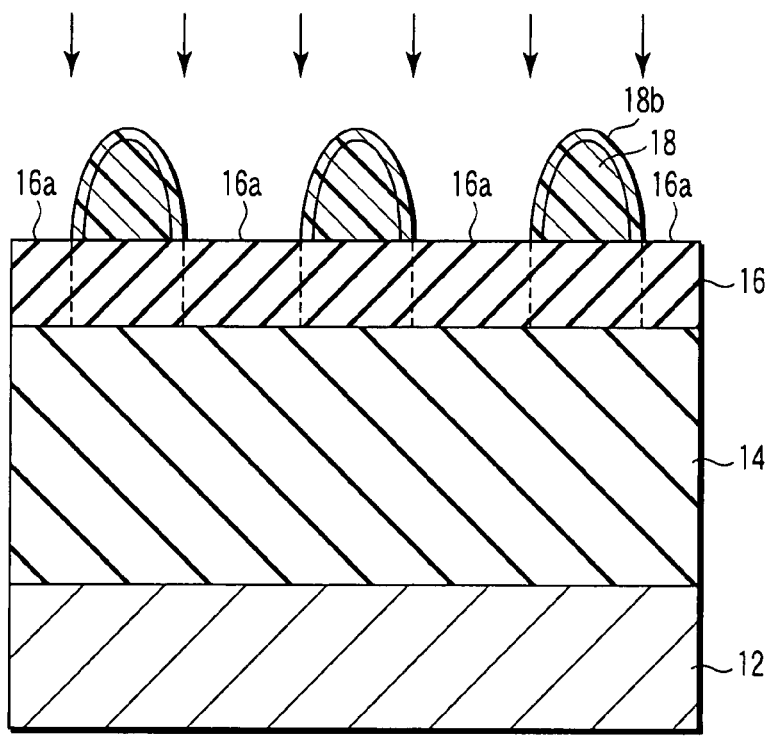

In order to solve the problem described above, according to this embodiment, as shown in FIG. 2, a predetermined dopant is implanted into the intermediate film 16, while the photo-resist pattern 18 is used as a mask, to increase the etching rate of the intermediate film 16. Specifically, ion implantation of boron (B) is performed. With this ion implant, an implantation layer 16a is formed in the intermediate film 16. In FIG. 2, the implantation layer 16a is formed over the entire thickness of the intermediate film 16, but the depth of the implantation layer 16a may be adjusted by controlling the implantation energy. In other words, the implantation layer 16a may be formed not over the entire thickness of intermediate film 16. Boron ions are also implanted into the surface area of the photo-resist pattern 18, so a modified layer 18b is formed in the surface area of the photo-resist pattern 18. The thickness of the modified layer 18b is larger on the upper surface of the photo-resist pattern 18 than on the side surface of the photo-resist pattern 18. Further, the skirt portions 18a of the photo-resist pattern 18 are removed by the sputtering effect of boron ions.

Then, as shown in FIG. 3, a first portion 16b of the intermediate film 16, which is at least a part of the implantation layer 16a, is etched by use of a predetermined etching agent, while the photo-resist pattern 18 is used as a mask. Specifically, wet etching using hydrofluoric acid (HF) vapor is performed. The implantation layer 16a contains boron and has an etching rate thereby increased. For example, the portion of the intermediate film 16 containing boron at a high concentration has an etching rate about ten times higher than that of the portion containing no boron. Accordingly, the portion containing boron at a high concentration can be selectively etched. In other word, the first portion 16b can be etched while the portion of the intermediate film 16 below the photo-resist pattern 18 is scarcely etched. Consequently, the photo-resist pattern 18 is faithfully transferred to the intermediate film 16.

As described above, the first portion 16b is removed by wet etching. Since wet etching mainly utilizes a chemical etching effect, the etching selectivity ratio can be easily increased, but the etching proceeds in an isotropic manner in general. In this respect, according to this embodiment, the etching selectivity ratio has been increased by boron ion implantation, the etching proceeds substantially in an anisotropic manner even by wet etching. Thus, the first portion 16b is selectively etched while the portion below the photo-resist pattern 18 is scarcely etched. Consequently, the photo-resist pattern 18 is faithfully transferred to the intermediate film 16. Further, since wet etching is used, the first portion 16b of the intermediate film 16 is etched while the photo-resist pattern 18 is substantially not etched.

The skirt portions 18a of the photo-resist pattern 18 are removed by the ion implantation step shown in FIG. 2. Accordingly, the etching is not inhibited by the skirt portions 18a. Because of this reason as well, the first portion 16b can be reliably etched.

Since the implantation layer 16a is formed by ion implantation, boron in the implantation layer 16a has a concentration distribution in the film thickness direction. Accordingly, in this embodiment, the implantation layer 16a is not entirely etched. The portion below the first portion 16b which contains boron at a low concentration is not etched. In other words, the implantation layer 16a is partly etched. However, where the entire implantation layer 16a contains boron at a high concentration, the entire implantation layer 16a can be etched.

Then, as shown in FIG. 4, anisotropic dry etching using a predetermined etching gas is performed, while the photo-resist pattern 18 is used as a mask, to etch a second portion 16c below the first portion 16b. Since this is anisotropic etching, the photo-resist pattern 18 is faithfully transferred to the intermediate film 16. Specifically, this anisotropic dry etching is performed by use of a fluorocarbon family (CF family) gas to etch the second portion 16c. The thickness of the second portion 16c of the intermediate film 16 can be set fairly smaller by the wet etching step shown in FIG. 3. Accordingly, the dry etching time can be shortened to a certain extent. Further, the modified layer 18b is formed in the surface area of the photo-resist pattern 18. The modified layer 18b improves the dry etching resistance of the photo-resist pattern 18. Consequently, when the dry etching is performed, the photo-resist pattern 18 adequately serves as an etching mask. It follows that a third portion 16d of the intermediate film 16 can be reliably formed with high accuracy below the photo-resist pattern 18. The photo-resist pattern 18 may be slightly etched by the dry etching step, but, even so, the photo-resist pattern 18 can adequately serve as an etching mask because of the reason described above.

As described above, in the wet etching step shown in FIG. 3, the etching rate of the first portion 16b is high, and the etching thereby proceeds substantially in an anisotropic manner. Further, in the dry etching step shown in FIG. 4, the photo-resist pattern 18 adequately serves as an etching mask, and the anisotropic etching is thereby reliably performed. Consequently, side etching is sufficiently suppressed, so that the portion (third portion 16d) of the intermediate film 16 below the photo-resist pattern 18 is formed with high accuracy.

Figure 5:
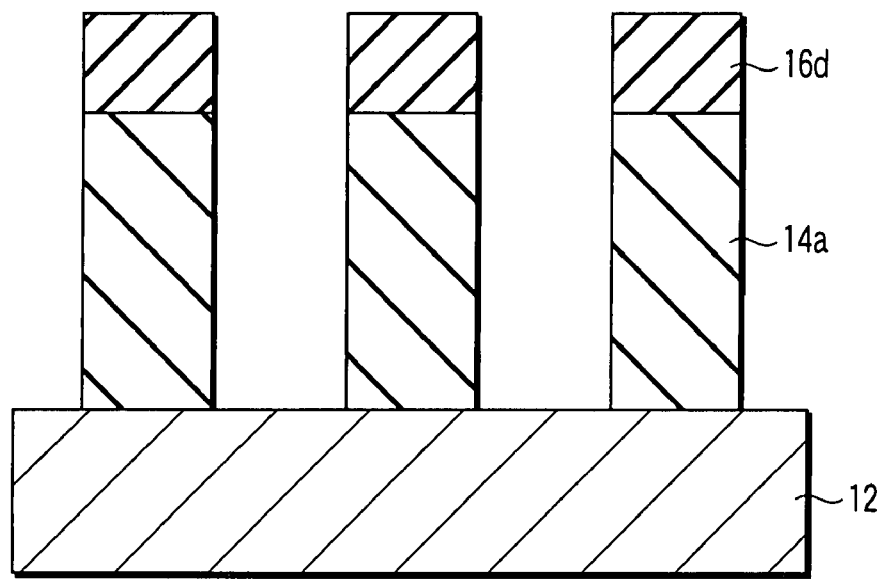

Then, as shown in FIG. 5, anisotropic dry etching is performed, while the photo-resist pattern 18 and the third portion 16d of the intermediate film 16 are used as a mask, to etch the lower film 14. Specifically, the dry etching is performed by use of oxygen gas ($O_2$ gas) to etch the lower film 14. During this dry etching, the photo-resist pattern 18 disappears. After the photo-resist pattern 18 disappears, the third portion 16d serves as an etching mask. With this dry etching step, a stacked mask pattern formed of the third portion 16d of the intermediate film 16 and a lower film pattern 14a is formed.

Figure 6:
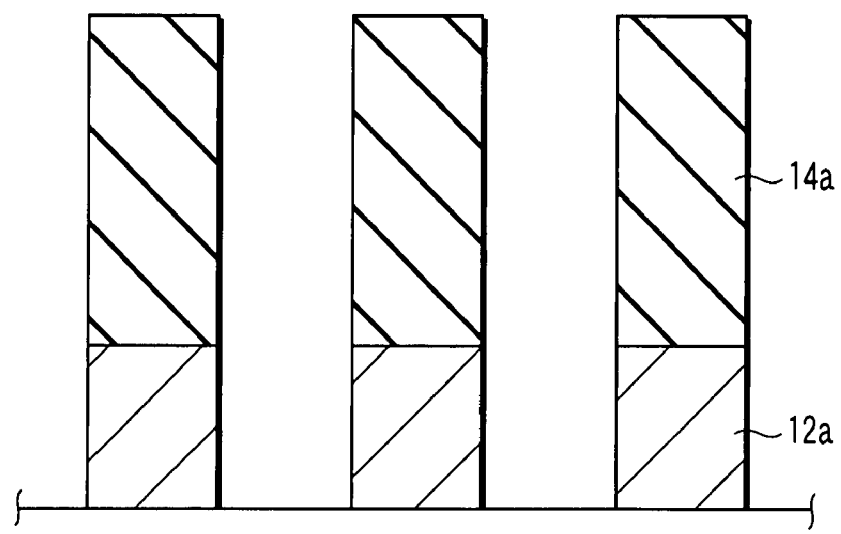

Then, as shown in FIG. 6, anisotropic dry etching is performed, while the stacked mask pattern described above is used as a mask, to etch the etching target film 12. During this dry etching, the third portion 16d disappears, and, thereafter, the lower film pattern 14a serves as an etching mask. With this dry etching step, an interconnection pattern 12a is formed. As described above, in this embodiment, since the photo-resist pattern 18 is faithfully transferred to the intermediate film 16, the interconnection pattern 12a can be formed with high accuracy.

As has been described above, according to this embodiment, in the ion implantation step shown in FIG. 2, the implantation layer 16a is formed in the intermediate film 16 to increase the etching rate of the intermediate film 16. Accordingly, in the wet etching step shown in FIG. 3, the first portion 16b of the intermediate film 16 can be etched at a high selectivity ratio. Consequently, it is possible to reliably form an adequate pattern at the intermediate film 16 with high accuracy.

Since the first portion 16b has a sufficiently high etching rate (that results in a high etching selectivity ratio), the etching proceeds substantially in an anisotropic manner even by wet etching that proceeds in an isotropic manner under ordinary circumstances. Consequently, it is possible to reliably form an adequate pattern at the intermediate film 16 with high accuracy. Further, since wet etching is used, the first portion 16b of the intermediate film 16 can be etched while the photo-resist pattern 18 is scarcely etched.

According to this embodiment, the skirt portions of the photo-resist pattern 18 can be removed by the ion implantation step shown in FIG. 2, and thus do not inhibit the etching. This also makes it possible to perform effective etching of the first portion 16b of the intermediate film 16, thereby reliably forming an adequate pattern at the intermediate film 16 with high accuracy.

According to this embodiment, the modified layer 18b is formed in the surface area of the photo-resist pattern 18 by the ion implantation step shown in FIG. 2. The modified layer 18b improves the dry etching resistance of the photo-resist pattern 18. Consequently, when the second portion 16c of the intermediate film 16 is etched in the dry etching step shown in FIG. 4, the photo-resist pattern 18 adequately serves as an etching mask. This also makes it possible to reliably form an adequate pattern at the intermediate film 16 with high accuracy.

Therefore, according to this embodiment, the third portion 16d of the intermediate film 16 can be reliably formed with high accuracy below the photo-resist pattern 18, so that the third portion 16d can serve as an etching mask with high reliability and high accuracy. Consequently, it is possible to form a pattern at the etching target film 12 with high accuracy.

In the embodiment described above, the multilayer resist has a three-layer structure formed of the lower film 14, intermediate film 16, and upper film (photo-resist film) 18. However, a multilayer resist having a two-layer structure including a photo-resist film may be used. Further, in place of use of a multilayer resist structure, the photo-resist pattern 18 may be formed directly on the etching target film 12. Also in these cases, the same method as described above with reference to the embodiment may be used.

In the embodiment described above, the photo-resist pattern 18 includes the skirt portions 18a. However, the same method as described above with reference to the embodiment may be applied to a case where the photo-resist pattern 18 includes no skirt portions 18a.

In the embodiment described above, the modified layer 18b is formed all over the surface area of the photo-resist pattern 18. However, it suffices if the modified layer 18b is formed at least in the upper surface area of the photo-resist pattern 18. If the modified layer 18b is present at least in the upper surface area of the photo-resist pattern 18, the photo-resist pattern 18 can have a sufficient anisotropic dry etching resistance, when the anisotropic dry etching is performed in the step shown in FIG. 4 to etch the second portion 16c of the intermediate film 16.

In the embodiment described above, boron is used as a dopant in the ion implantation step shown in FIG. 2. However, a dopant other than boron may be used, as long as the dopant can increase the etching rate of the underlying film (first film) below the photo-resist pattern 18.

In the embodiment described above, wet etching is used in the etching step shown in FIG. 3. However, dry etching using a gas that provides a high etching selectivity ratio may be used.

In the embodiment described above, wet etching is performed in the step shown in FIG. 3 and dry etching is performed in the step shown in FIG. 4. However, where the intermediate film 16 contains boron (a dopant) at a high concentration over the entire thickness, it may be arranged such that only the wet etching step shown in FIG. 3 is performed while the dry etching step shown in FIG. 4 is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the method comprising:
    forming a photo-resist pattern above a first film;
    implanting a predetermined dopant that increases an etching rate of the first film into the first film using the photo-resist pattern as a mask, thereby forming an implantation layer in the first film; and
    etching a first portion of the first film, which is at least a part of the implantation layer, using the photo-resist pattern as a mask,
    wherein wet etching is used for etching the first portion of the first film.

2. The method according to claim 1, wherein the first film includes a second portion below the first portion, and
    the method further comprises etching the second portion by anisotropic dry etching using the photo-resist pattern as a mask, after etching the first portion of the first film.

3. The method according to claim 1, wherein the first portion is etched substantially in an anisotropic manner, in etching the first portion of the first film.

4. The method according to claim 1, wherein the photo-resist pattern is substantially not etched, in etching the first portion of the first film.

5. The method according to claim 1, wherein the implantation layer is formed by ion implantation.

6. The method according to claim 1, wherein the predetermined dopant includes boron.

7. The method according to claim 1, wherein the predetermined dopant in the implantation layer has a concentration distribution in a thickness direction of the implantation layer.

8. The method according to claim 1, wherein the first film includes a second portion below the first portion, and
    the predetermined dopant has a concentration higher in the first portion than in the second portion.

9. The method according to claim 1, wherein the first film is formed of a silicon oxide family film.

10. The method according to claim 1, wherein a modified layer is formed at least in an upper surface area of the photo-resist pattern by the predetermined dopant implanted therein, in implanting the predetermined dopant into the first film.

11. The method according to claim 10, wherein the modified layer increases an etching resistance of the photo-resist pattern.

12. The method according to claim 1, wherein the photo-resist pattern has a skirt portion along a surface of the first film, and
    the skirt portion is removed in implanting the predetermined dopant into the first film.

13. The method according to claim 12, wherein the skirt portion is removed by a sputtering effect of the predetermined dopant.

14. The method according to claim 12, wherein the photo-resist pattern has an inclined sidewall.

15. The method according to claim 1, wherein the first film is formed on a second film,
    the first film includes a third portion below the photo-resist pattern, and
    the method further comprises etching the second film using the third portion as a mask, after etching the first portion of the first film.

16. The method according to claim 15, wherein the second film is etched by anisotropic dry etching, in etching the second film.

17. The method according to claim 15, wherein the second film contains carbon as a main component.

18. The method according to claim 15, wherein the second film is formed on a third film, and the method further comprises etching the third film using as a mask a stacked pattern formed of the first film and the second film, after etching the second film.

* * * * *